US012245368B2

(12) United States Patent
Lee et al.

(10) Patent No.: US 12,245,368 B2
(45) Date of Patent: Mar. 4, 2025

(54) STRETCHABLE DEVICE AND DISPLAY PANEL AND SENSOR AND ELECTRONIC DEVICE

(71) Applicant: Samsung Electronics Co., Ltd., Suwon-si (KR)

(72) Inventors: Yeongjun Lee, Seongnam-si (KR); Gae Hwang Lee, Seongnam-si (KR); Jong Won Chung, Hwaseong-si (KR); Joo Young Kim, Hwaseong-si (KR); Youngjun Yun, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 605 days.

(21) Appl. No.: 17/336,755

(22) Filed: Jun. 2, 2021

(65) Prior Publication Data
US 2022/0030705 A1  Jan. 27, 2022

(30) Foreign Application Priority Data

Jul. 27, 2020 (KR) .......................... 10-2020-0093154

(51) Int. Cl.
*H05K 1/02* (2006.01)
*H01L 27/12* (2006.01)
(Continued)

(52) U.S. Cl.
CPC ....... *H05K 1/0283* (2013.01); *H01L 27/1218* (2013.01); *H05K 1/0277* (2013.01);
(Continued)

(58) Field of Classification Search
CPC ...... H05K 1/0283; H05K 1/0366; H05K 1/18; H05K 2201/0133; H05K 2201/10151;
(Continued)

(56) References Cited

U.S. PATENT DOCUMENTS

| 10,462,897 B2 | 10/2019 | Fedder et al. |
| 10,468,357 B2 | 11/2019 | Dias et al. |

(Continued)

FOREIGN PATENT DOCUMENTS

| CN | 104517527 A | 4/2015 |
| CN | 104736654 A | 6/2015 |

(Continued)

OTHER PUBLICATIONS

English Translation JP2013/168575, Hirano et al. (Year: 2013).*
(Continued)

*Primary Examiner* — Steven T Sawyer
(74) *Attorney, Agent, or Firm* — Harness, Dickey & Pierce, P.L.C.

(57) ABSTRACT

A stretchable substrate includes a first elastomer, a plurality of unit devices on the stretchable substrate, a connecting wire configured to electrically connect adjacent unit devices, and a plurality of auxiliary structures each including a second elastomer and each at least partially overlapping with at least one unit device or the connecting wire, wherein the first elastomer and the second elastomer are separate, respective polymers that commonly include at least one structural unit.

17 Claims, 8 Drawing Sheets

(51) Int. Cl.
    *H05K 1/03*     (2006.01)
    *H10K 77/10*    (2023.01)
    *H05K 1/18*     (2006.01)
    *H10K 102/00*   (2023.01)

(52) U.S. Cl.
    CPC ......... *H05K 1/0366* (2013.01); *H10K 77/111* (2023.02); *H05K 1/18* (2013.01); *H05K 2201/0133* (2013.01); *H05K 2201/10151* (2013.01); *H10K 2102/311* (2023.02)

(58) Field of Classification Search
    CPC ................. H05K 1/181; H05K 1/0313; H05K 2201/10128; H05K 1/0277; H01L 27/1218; H10K 77/111; H10K 2102/311; H10K 59/10; H10K 59/131; Y02E 10/549; G09F 9/301; C08L 23/08
    See application file for complete search history.

(56) References Cited

U.S. PATENT DOCUMENTS

| | | | |
|---|---|---|---|
| 10,923,670 B2 | 2/2021 | Yoo et al. | |
| 2014/0218872 A1* | 8/2014 | Park | H05K 1/0283 216/13 |
| 2014/0299362 A1* | 10/2014 | Park | H05K 1/0283 174/254 |
| 2015/0147854 A1* | 5/2015 | Jung | H01L 21/311 438/197 |
| 2017/0331045 A1* | 11/2017 | Chung | H10K 10/488 |
| 2017/0374736 A1 | 12/2017 | Reit et al. | |
| 2018/0302988 A1 | 10/2018 | Hsu | |
| 2020/0260573 A1* | 8/2020 | Ogawa | H05K 1/0281 |
| 2020/0281073 A1* | 9/2020 | Okimoto | H05K 1/189 |
| 2022/0020298 A1* | 1/2022 | Chun | B32B 27/40 |

FOREIGN PATENT DOCUMENTS

| | | |
|---|---|---|
| CN | 110739333 A | 1/2020 |
| JP | 2013-168575 A | 8/2013 |
| KR | 2016-0087291 A | 7/2016 |
| KR | 2019-0115609 A | 10/2019 |

OTHER PUBLICATIONS

Extended European Search Report dated Jan. 10, 2022 for corresponding European Application No. 21186958.1.
Communication pursuant to Article 94(3) EPC dated Dec. 14, 2023 for corresponding European Application No. 21186958.1.
Chinese Office Action dated Dec. 31, 2024 for corresponding Chinese Application No. 202110849025.9, and English-language translation thereof.

* cited by examiner

STRETCHABLE DEVICE AND DISPLAY PANEL AND SENSOR AND ELECTRONIC DEVICE

CROSS-REFERENCE TO RELATED APPLICATION

This application claims priority to and the benefit of Korean Patent Application No. 10-2020-0093154 filed in the Korean Intellectual Property Office on Jul. 27, 2020, the entire contents of which are incorporated herein by reference.

BACKGROUND

1. Field

A stretchable device, a display panel, a sensor, and an electronic device are disclosed.

2. Description of the Related Art

Recently, research on an attachable device directly attaching a display device or a biometric device such as a smart skin device, a soft robot, and a biomedical device to skin or clothing has been made. This attachable device is required of stretchability of flexibly responding to motions of a living body and being recovered to its original state.

SUMMARY

Some example embodiments provide a stretchable device capable of reducing or preventing damage to the device by stretching.

Some example embodiments provide a display panel including the stretchable device.

Some example embodiments provide a sensor including the stretchable device.

Some example embodiments provide an electronic device including the stretchable device, the display panel or the sensor.

According to some example embodiments, a stretchable device includes a stretchable substrate including a first elastomer, a plurality of unit devices on the stretchable substrate, a connecting wire configured to electrically connect adjacent unit devices of the plurality of unit devices, and a plurality of auxiliary structures. Each auxiliary structure of the plurality of auxiliary structures may be at least partially overlapping with at least one unit device of the plurality of unit devices and/or the connecting wire in a vertical direction that is perpendicular to an upper surface of the stretchable substrate, the plurality of auxiliary structures each including a second elastomer. The first elastomer and the second elastomer may be separate, respective polymers that commonly include at least one structural unit.

An elastic modulus of the second elastomer may be higher than an elastic modulus of the first elastomer.

The elastic modulus of the second elastomer may be higher than the elastic modulus of the first elastomer and lower than the elastic modulus of each separate unit device of the plurality of unit devices.

Each of the first elastomer and the second elastomer may be a thermoplastic elastomer.

The first elastomer and the second elastomer may commonly belong to one of a styrene-containing polymer, an olefin-containing polymer, a urethane-containing polymer, or an ether-containing polymer.

The first elastomer may be a first copolymer that includes a hard-structural unit of the first elastomer and a soft-structural unit of the first elastomer. The second elastomer may be a second copolymer that includes a hard-structural unit of the second elastomer and a soft-structural unit of the second elastomer. The first elastomer and the second elastomer may commonly include at least one hard-structural unit.

Each of the first elastomer and the second elastomer may commonly include a styrene-containing structural unit.

The soft-structural unit of the first elastomer and the soft-structural unit of the second elastomer may each include an ethylene structural unit, a propylene structural unit, a butylene structural unit, an isobutylene structural unit, a butadiene structural unit, an isoprene structural unit, or a combination thereof.

A weight ratio of the hard-structural unit of the second elastomer to the soft-structural unit of the second elastomer may be greater than a weight ratio of the hard-structural unit of the first elastomer to the soft-structural unit of the first elastomer.

The weight ratio of the hard-structural unit of the first elastomer to the soft-structural unit of the first elastomer may be less than about 1, and the weight ratio of the hard-structural unit of the second elastomer to the soft-structural unit of the second elastomer may be greater than about 1.

The weight ratio of the hard-structural unit of the first elastomer to the soft-structural unit of the first elastomer may be less than or equal to about 0.5 and the weight ratio of the hard-structural unit of the second elastomer to the soft-structural unit of the second elastomer may be greater than or equal to about 1.5.

Each auxiliary structure of the plurality of auxiliary structures may be under or on the lower or upper surface of the stretchable substrate, or may be embedded in the stretchable substrate.

An area of each particular auxiliary structure may be larger than an area of a corresponding unit device of the plurality of unit devices at least partially overlapped by the particular auxiliary structure.

The plurality of unit devices may each include a light emitting device, a light absorbing device, a transistor, a resistance device, an imaging device, or a combination thereof.

According to some example embodiments, a stretchable device includes a stretchable substrate, a plurality of unit devices on the stretchable substrate, a connecting wire configured to electrically connect adjacent unit devices of the plurality of unit devices, and a plurality of auxiliary structures under or on or inside the stretchable substrate. The plurality of auxiliary structures may be at least partially overlapping with at least one unit device of the plurality of unit devices and/or the connecting wire in a vertical direction that is perpendicular to an upper surface of the stretchable substrate. The stretchable substrate may include a first copolymer, the first copolymer including a hard-structural unit and a soft-structural unit. Each auxiliary structure of the plurality of auxiliary structures may include a second copolymer, the second copolymer including a hard-structural unit and a soft-structural unit. A weight ratio of the hard-structural unit of the second copolymer to the soft-structural unit of the second copolymer may be larger than a weight ratio of the hard-structural unit of the first copolymer to the soft-structural unit of the first copolymer.

The weight ratio of the hard-structural unit of the first copolymer to the soft-structural unit of the first copolymer may be less than about 1 and the weight ratio of the hard-structural unit of the second copolymer to the soft-structural unit of the second copolymer may be greater than about 1.

The weight ratio of the hard-structural unit of the first copolymer to the soft-structural unit of the first copolymer may be less than or equal to about 0.5 and the weight ratio of the hard-structural unit of the second copolymer to the soft-structural unit of the second copolymer may be greater than or equal to about 1.5.

The stretchable substrate and the plurality of auxiliary structures commonly include at least one same hard-structural unit, and the at least one same hard-structural unit includes a styrene-containing structural unit.

The soft-structural unit of the second copolymer and the soft-structural unit of the first copolymer may each include an ethylene structural unit, a propylene structural unit, a butylene structural unit, an isobutylene structural unit, a butadiene structural unit, an isoprene structural unit, or a combination thereof.

The stretchable substrate and the plurality of auxiliary structures may each include one of styrene-ethylene-butylene-styrene SEBS, styrene-ethylene-propylene-styrene SEPS, styrene-butadiene-styrene SBS, and styrene- isoprene-styrene SIS, styrene-isobutylene-styrene SIBS, or a combination thereof.

According to some example embodiments, a display panel including the stretchable device is provided.

According to some example embodiments, a sensor including the stretchable device is provided.

According to some example embodiments, an electronic device including the stretchable device, the display panel, or the sensor is provided.

The stretchable device may effectively reduce or prevent damage by stretching.

DETAILED DESCRIPTION

Figure 1:
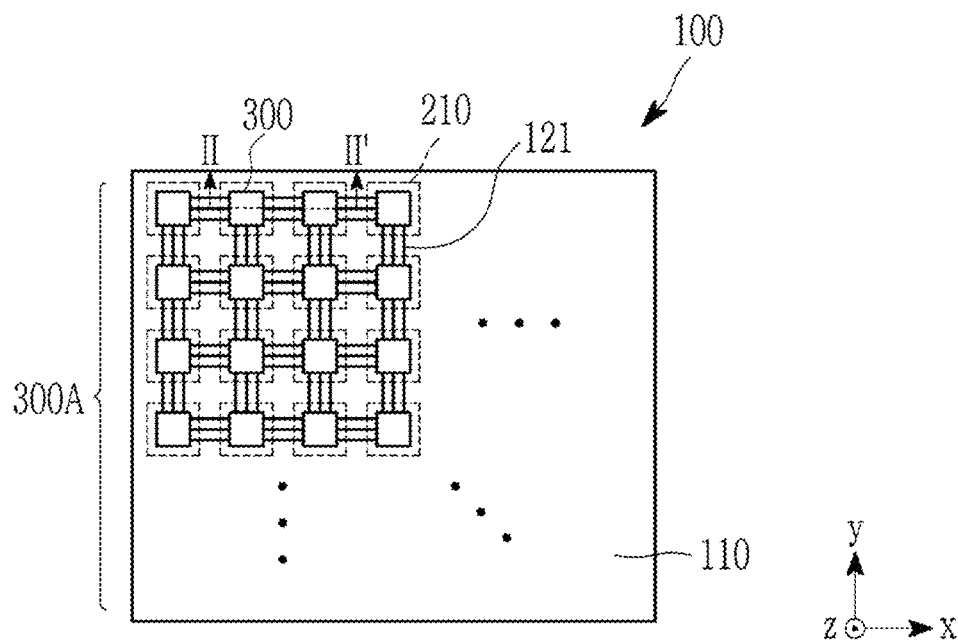
FIG. 1 is a plan view showing an arrangement of a stretchable device according to some example embodiments.

Hereinafter, implementation examples will be described in detail so that those of ordinary skill in the art can easily implement them. However, the structure that is actually applied may be implemented in various different forms, and is not limited to the example embodiments described herein.

In the drawings, the thickness of layers, films, panels, regions, etc., are exaggerated for clarity.

It will be understood that when an element such as a layer, film, region, or substrate is referred to as being "on" another element, it may be directly on the other element or intervening elements may also be present. In contrast, when an element is referred to as being "directly on" another element, there are no intervening elements present.

Hereinafter, as used herein, when a definition is not otherwise provided, "substituted" refers to replacement of hydrogen of a compound or a functional group by a substituent selected from a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a silyl group, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroaryl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

Hereinafter, "combination" refers to a mixture or a stacked structure of two or more.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%)).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%)).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal"

as other elements, and it will be further understood that elements and/or properties thereof recited herein as being "the same" as or "equal" to other elements may be "the same" as or "equal" to or "substantially the same" as or "substantially equal" to the other elements and/or properties thereof. Elements and/or properties thereof that are "substantially the same" as or "substantially equal" to other elements and/or properties thereof will be understood to include elements and/or properties thereof that are the same as or equal to the other elements and/or properties thereof within manufacturing tolerances and/or material tolerances. Elements and/or properties thereof that are the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Hereinafter, a stretchable device according to some example embodiments is described with reference to the drawings.

Figure 2:
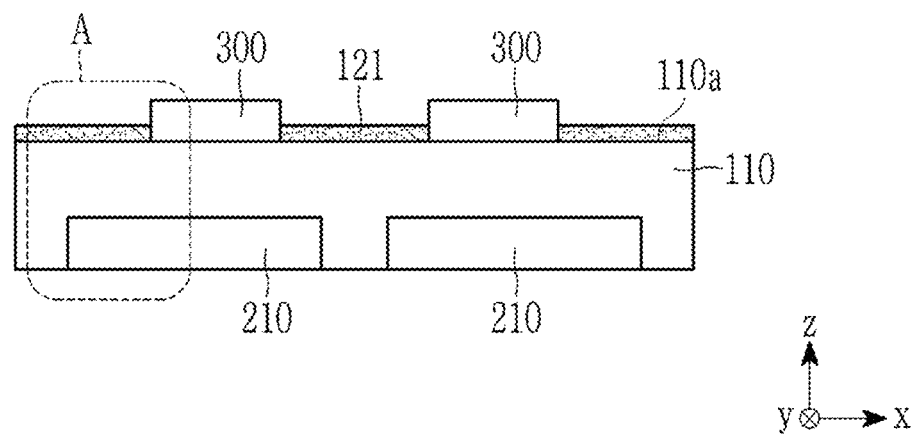
FIG. 2 is a cross-sectional view of the stretchable device of FIG. 1 taken along line II-II'.
Figure 3:
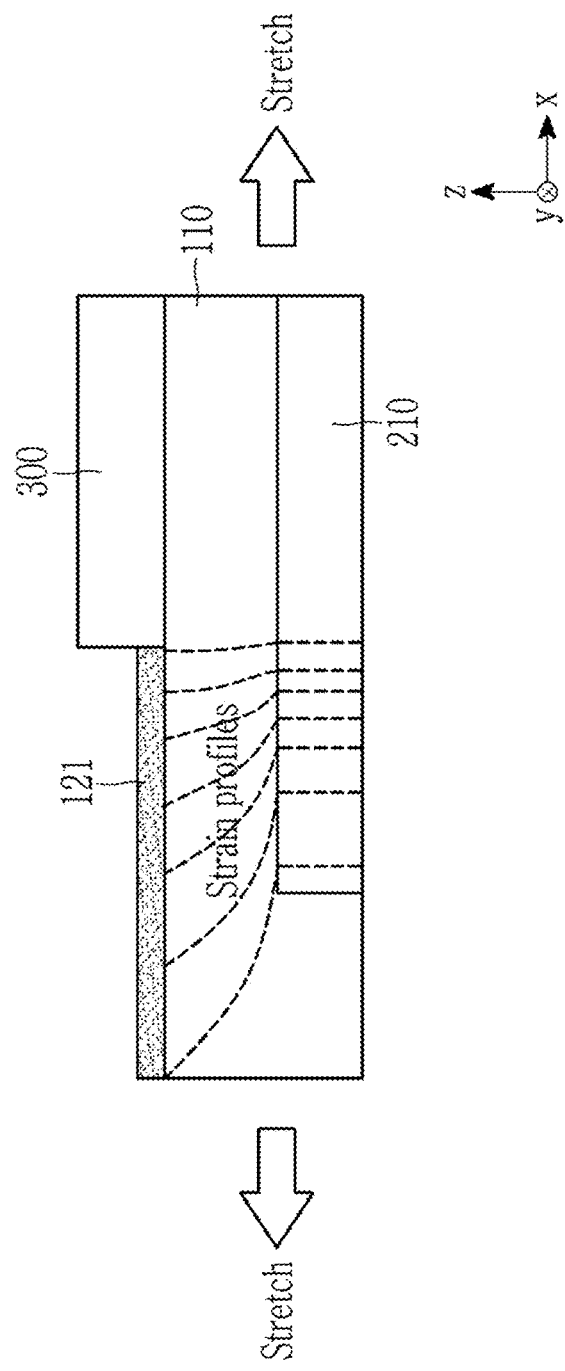
FIG. 3 is a cross-sectional view showing an enlarged portion A of FIG. 2.

FIG. 1 is a plan view showing an arrangement of a stretchable device according to some example embodiments, FIG. 2 is a cross-sectional view of the stretchable device of FIG. 1 taken along line II-II', and FIG. 3 is a cross-sectional view showing an enlarged portion A of FIG. 2, Referring to FIGS. 1 and 2, a stretchable device 100 according to some example embodiments includes a substrate 110, a plurality of unit devices 300 arranged on the substrate 110, and a connecting wire 121 configured to connect a plurality of unit devices 300, and a plurality of auxiliary structures 210.

The substrate 110 may be a stretchable substrate that may be stretched in a particular (or, alternatively, predetermined) direction and restored again. The substrate 110 may include a first elastomer having elasticity, which will be described later. The substrate 110 may be, for example, a light-transmitting (e.g., at least partially transparent) substrate.

The plurality of unit devices 300 are aligned on the substrate 110, for example, along a raw and/or a column, forming an array 300A. The plurality of unit devices 300 may be aligned, for example, as a Bayer matrix, a PenTile matrix, a diamond matrix, and/or the like, but is not limited thereto. The plurality of unit devices 300 may be the same or different one another, and each unit device 300 may each include, for example, a light emitting device such as an organic light emitting diode, an inorganic light emitting diode, a quantum dot light emitting diode, a micro light emitting diode, or perovskite light emitting diode; a light absorbing device such as a photoelectric conversion device; a transistor such as a thin film transistor; a resistance device; an imaging device, or a combination thereof, but is not limited thereto. Each unit device 300 may include a conductor such as an electrode, a semiconductor such as an active layer, an insulator, and the like, but is not limited thereto.

For example, each unit device 300 may be a light emitting device configured to independently display light including the red wavelength spectrum, green wavelength spectrum, blue wavelength spectrum, or a combination thereof. For example, the light emitting device may include a pair of electrodes and a light emitting layer between the pair of electrodes and configured to emit light in a red wavelength spectrum, a green wavelength spectrum, a blue wavelength spectrum, or a combination thereof. For example, each unit device 300 may be a light absorbing device configured to absorb light in a red wavelength spectrum, a green wavelength spectrum, a blue wavelength spectrum, an infrared wavelength spectrum, or a combination thereof. For example, the light absorbing device may include a pair of electrodes and a light-absorbing layer between the pair of electrodes and configured to absorb light in a red wavelength spectrum, a green wavelength spectrum, a blue wavelength spectrum, an infrared wavelength spectrum, or a combination thereof. For example, the plurality of unit devices 300 may include a plurality of light emitting devices and a plurality of light absorbing devices, which are alternately arranged along a row and/or a column.

For example, each unit device 300 may include at least one thin film transistor. The thin film transistor may include, for example, a switching transistor and/or a driving transistor. The switching transistor is electrically connected to a gate line and a data line and may include a first gate electrode connected to the gate line; a first source electrode connected to the data line; a first drain electrode facing the first source electrode; and a first semiconductor electrically connected to the first source electrode and the first drain electrode. The driving transistor may include a second gate electrode electrically connected to the first drain electrode; a second source electrode connected to a driving voltage line; a second drain electrode facing the second source electrode; and a second semiconductor electrically connected to the second source electrode and the second drain electrode. For example, the first semiconductor and the second semiconductor may individually include a semiconductor material and an elastomer. For example, the first semiconductor and the second semiconductor may include an organic semiconductor material and the elastomer.

In the drawing, all the unit devices 300 have the same size but are not limited thereto, and at least one unit device 300 may be larger or smaller than the other unit devices 300. In the drawing, all the unit devices 300 have the same shape but are not limited thereto, and at least one unit device 300 may have a different shape from those of the other unit devices 300.

A (e.g., each) connecting wire 121 may be disposed between adjacent unit devices 300 of the plurality of unit devices and thus may be configured to electrically connect the adjacent unit devices 300. In some example embodiments, separate, respective connecting wires 121 may be included in the stretchable device 100 between adjacent unit devices 300 and configured to electrically connect same. The connecting wire 121 may be one or at least two and aligned in a row direction (e.g., x direction) and a column direction (e.g., y direction) between the unit devices 300 arranged along a row and/or a column. The connecting wire 121 may be connected to a signal line (not shown), and the signal line may include, for example, the gate line transmitting gate signals (or scan signals), the data line transmitting data signals, a driving voltage line applying a driving voltage, and/or a common voltage line applying a common voltage but is not limited thereto. The connecting wire 121 may include, for example, a low resistance conductor, for example, silver, gold, copper, aluminum, or an alloy thereof.

Each auxiliary structure 210 of the plurality of auxiliary structures 210 may be an island structure at least partially overlapping with the unit device 300 and/or the connecting wire 121 (e.g., in the Z direction) and the plurality of auxiliary structures 210 may be spaced apart to be disposed at (e.g., establish) a particular (or, alternatively, predetermined) gap (e.g., interval spacing) between adjacent auxiliary structures 210, for example as shown in at least FIGS. 1-2.

For example, the auxiliary structures 210 may be aligned to correspond to the unit devices 300, for example, along the row and/or the column. In some example embodiments, and as shown in at least FIGS. 1-2, each auxiliary structure 210 may at least partially overlap (e.g., in the Z direction) with at least one unit device 300 of the plurality of unit device 300 and/or with a connecting wire 121. As shown in FIG. 2, the Z direction may be perpendicular to an upper surface 110a of the substrate 110. For example, the auxiliary structure 210 may overlap (e.g., in the Z direction) with the unit device 300 and be aligned over (e.g., overlap in the Z direction) a portion of the connecting wire 121, and accordingly, an area of an auxiliary structure 210 (e.g., an area in the X-Y plane of each particular auxiliary structure 210) may be larger than an area of a unit device 300 (e.g., larger than an area in the X-Y plane of each corresponding unit device 300 at least partially overlapped in the Z direction by the particular auxiliary structure 210). For example, the auxiliary structures 210 may be randomly aligned.

In the drawing (FIGS. 1-2), each auxiliary structure 210 is disposed under (e.g., at least partially overlapping in the Z direction) a separate unit device 300 and connecting wire 121 but limited thereto and disposed on the unit device 300 and the connecting wire 121. In addition, in the drawing, each auxiliary structure 210 is disposed in the substrate 110 but limited thereto and it may be disposed on or under the substrate 110. Each auxiliary structure 210 of the plurality of auxiliary structures 210 may be under or on the substrate 110 or may be embedded in the substrate 110. The auxiliary structures 210 may be under, on, or inside the substrate 110.

Stiffness of the auxiliary structure 210 may respectively differ from those of the substrate 110, the unit device 300, and the connecting wire 121. Herein, the stiffness indicates a degree of resistance against deformation, when an external force is given from outside, and when the stiffness is relatively high, the resistance against deformation is relatively large, and thus the deformation is small, but when the stiffness is relatively low, the resistance against deformation is relatively small, and thus the deformation is large. Specifically, the stiffness of the auxiliary structure 210 may be relatively higher than that of the substrate 110 and relatively lower than those of the unit device 300 and the connecting wire 121. The stiffness may be evaluated from an elastic modulus, wherein a high elastic modulus may mean high stiffness, while a low elastic modulus may mean low stiffness. The elastic modulus may be, for example, a Young's modulus.

Each auxiliary structure 210 may include the second elastomer. The second elastomer may have a higher elastic modulus than that of the first elastomer included in the substrate 110. Restated, the elastic modulus of the second elastomer may be higher than an elastic modulus of the first elastomer. For example, the elastic modulus of the second elastomer may be greater than or equal to about 50 times higher than that of the first elastomer, within the range, greater than or equal to about 80 times, greater than or equal to about 100 times, greater than or equal to about 150 times, or greater than or equal to about 200 times, for example, about 50 times to about 100,000 times, about 80 times to about 100,000 times, about 100 times to about 100,000 times, about 150 times to about 100,000 times, or about 200 times to about 100,000 times as high as that of the first elastomer, but is not limited thereto. For example, the elastic modulus of the first elastomer may be greater than or equal to about $10^2$ Pa and less than about $10^7$ Pa, and the elastic modulus of the second elastomer may be about $10^7$ Pa to about $10^{10}$ Pa, but is not limited thereto. In some example embodiments, the elastic modulus of the second elastomer may be lower than an elastic modulus (e.g., $10^{12}$ Pa) of each separate unit device 300 including an electrode and a component such as a metal, and/or the connecting wire 121. Restated, the elastic modulus of the second elastomer may be higher than an elastic modulus of the first elastomer and may be lower than an elastic modulus of each separate unit device 300 of the plurality of units devices 300 and/or the elastic modulus of the second elastomer may be lower than an elastic modulus of the plurality of units devices 300 and/or connecting wire(s) 121.

This elastic modulus difference of the first and second elastomers may bring about an elastic modulus difference of the substrate 110 and the auxiliary structure 210, and an elongation rate of the auxiliary structure 210 may be lower than that of the substrate 110. Herein, the elongation rate may be a percentage of a length change up to a breaking point relative to an initial length.

For example, the elongation rate of the auxiliary structure 210 may be less than or equal to about 100% and within the range, about 10% to about 100%, about 15% to about 100%, about 20% to about 100%, about 10% to about 80%, about 15% to about 80%, about 20% to about 80%, about 10% to about 50%, about 15% to about 50%, about 20% to about 50%, about 10% to about 40%, about 15% to about 40%, or about 20% to about 40%.

For example, the elongation rate of the substrate 110 may be greater than or equal to about 200% and within the range, greater than or equal to about 250%, greater than or equal to about 300%, or greater than or equal to about 500%, for example, about 200% to about 1000%, about 250% to about 1000%, about 300% to about 1000%, or about 500% to about 1000%.

For example, the first elastomer and the second elastomer may be respectively (e.g., may each be) a thermoplastic elastomer. The first elastomer and the second elastomer may be respectively a polymer including a plurality of structural units, which are the same or different one another, and include at least one common structural unit (e.g., at least one same structural unit) among them. Restated, the first elastomer and the second elastomer may be separate, respective polymers that commonly comprise (e.g., each include, etc.) at least one same structural unit. For example, the first elastomer and the second elastomer may include two types of structural units and commonly include one or two types of structural units among them. For example, the first elastomer and the second elastomer may include three types of structural units and commonly include one type, two types, or three types of structural units.

In this way, the first elastomer and the second elastomer commonly includes (e.g., may each include) at least one structural unit (e.g., at least one same structural unit) and thus may reduce heterogeneity at the interface of the substrate 110 including the first elastomer and the auxiliary structure 210 including the second elastomer and simultaneously, increase adhesive property of the interface of the substrate 110 and the auxiliary structure 210 by a chemical bond such as a cross-linking bond between the first elastomer and the second elastomer at a glass transition temperature (Tg) or a melting point (Tm) or higher due to thermoplastic properties of the first and second elastomers. Accordingly, when the stretchable device 100 or the substrate 110 is elongated, the auxiliary structure 210 may be prevented from separation or detachment from the substrate 110.

In some example embodiments, the substrate 110 and the auxiliary structure 210 may be formed by respectively coating and drying a solution including the first elastomer and a solution including the second elastomer, wherein the solution including the first elastomer and the solution including the second elastomer may respectively further include a hardener such as a photo hardener and/or a thermal hardener and thus improve chemical resistance and simultaneously, further promote a chemical bond such as a cross-linking bond of the first elastomer and the second elastomer and thus further improve adhesive property of the interface of the substrate 110 and the auxiliary structure 210.

For example, the first elastomer and the second elastomer may be independently a copolymer including at least one hard-structural unit providing relatively hard properties and at least one soft-structural unit providing relatively soft properties. Restated, the first elastomer may be a first copolymer that includes a hard-structural unit of the first elastomer and a soft-structural unit of the first elastomer, and the second elastomer may be a second copolymer that includes a hard-structural unit of the second elastomer and a soft-structural unit of the second elastomer. The first elastomer and the second elastomer may commonly comprise (e.g., each include, etc.) at least one same hard-structural unit. Restated, the substrate 110 and the auxiliary structures 210 may each include at least one same hard-structural unit, which may include, for example, a styrene-containing structural unit.

Each of the substrate 110 and the auxiliary structures 210 may independently include a copolymer that includes a hard-structural unit and a soft-structural unit. Restated, the substrate 110 may include a first copolymer, the first copolymer including a hard-structural unit of the stretchable substrate and a soft-structural unit of the stretchable substrate. The auxiliary structures 210 may each include a second copolymer, the second copolymer including a hard-structural unit of the plurality of auxiliary structures and a soft-structural unit of the plurality of auxiliary structures.

The first and second copolymers may include same or different copolymers.

The hard-structural unit may provide, for example, plastic properties such as high-temperature performance, thermoplastic processability, tensile strength, and tear strength, and the soft-structural unit may provide, for example, elastomeric properties such as low-temperature performance, hardness, flexibility, and tension/compression. The first elastomer and the second elastomer may exhibit thermoplastic elastic characteristics by appropriately disposing the hard-structural unit and the soft-structural unit. The hard-structural unit and the soft-structural unit may be alternately arranged or arranged as clusters or blocks in the first and second elastomers.

For example, the hard-structural unit may include, for example, a styrene-containing structural unit, an olefin-containing structural unit, a urethane-containing structural unit, an ether-containing structural unit, or a combination thereof, but is not limited thereto. For example, the soft-structural unit may include, for example, an ethylene structural unit, a propylene structural unit, a butylene structural unit, an isobutylene structural unit, a butadiene structural unit, an isoprene structural unit, or a combination thereof, but is not limited thereto.

For example, the first elastomer and the second elastomer may commonly include (e.g., may each include a same unit of) at least one hard-structural unit, for example, commonly include (e.g., each include a same unit of) a styrene-containing structural unit, an olefin-containing structural unit, a urethane-containing structural unit, an ether-containing structural unit, or a combination thereof. Accordingly, the first elastomer and the second elastomer may commonly belong to (e.g., may collectively include) one of a styrene-containing polymer, an olefin-containing polymer, and urethane-containing polymer, or an ether-containing polymer. Restated, the first elastomer and the second elastomer may include (e.g., may each include) a same material that is one of a styrene-containing polymer, an olefin-containing polymer, and urethane-containing polymer, or an ether-containing polymer. For example, the soft-structural unit of the auxiliary structures 210 and the soft-structural unit of the substrate 110 may each include an ethylene structural unit, a propylene structural unit, a butylene structural unit, an isobutylene structural unit, a butadiene structural unit, an isoprene structural unit, or a combination thereof.

For example, the first elastomer and the second elastomer may commonly include a styrene-containing structural unit as the hard-structural unit and also include the same or different soft-structural unit.

For example, the first elastomer and the second elastomer may commonly include a styrene-containing structural unit as the respective hard-structural unit thereof and, also, include an ethylene structural unit, a propylene structural unit, a butylene structural unit, an isobutylene structural unit, a butadiene structural unit, an isoprene structural unit, or a combination thereof as the respective soft-structural unit thereof. Restated in part, the soft-structural unit of the first elastomer and the soft-structural unit of the second elastomer each include a same or different structural unit that includes an ethylene structural unit, a propylene structural unit, a butylene structural unit, an isobutylene structural unit, a butadiene structural unit, an isoprene structural unit, or a combination thereof.

For example, the first elastomer and the second elastomer may be a styrene-containing polymer. For example, the first elastomer and the second elastomer independently may include one selected from styrene-ethylene-butylene-styrene SEBS, styrene-ethylene-propylene-styrene SE PS, styrene-butadiene-styrene SBS, styrene-isoprene-styrene SIS, styrene-isobutylene-styrene SIBS, and a combination thereof.

For example, either one of the first elastomer or the second elastomer may include styrene-ethylene-butylene-styrene SEBS, while the other one of the first elastomer or the second elastomer may include one selected from styrene-ethylene-butylene-styrene SEBS, styrene-ethylene-propylene-styrene SE PS, styrene-butadiene-styrene SBS, styrene-isoprene-styrene SIS, styrene-isobutylene-styrene SIBS, and a combination thereof. For example, the substrate 110 and the auxiliary structures 210 may each include one of styrene-ethylene-butylene-styrene SEBS, styrene-ethylene-propylene-styrene SEPS, styrene-butadiene-styrene SBS, and styrene-isoprene-styrene SIS, styrene-isobutylene-styrene SIBS, or a combination thereof.

For example, the first elastomer may include styrene-ethylene-butylene-styrene SEBS, and the second elastomer may include one selected from styrene-ethylene-butylene-styrene SEBS, styrene-ethylene-propylene-styrene SEPS, styrene-butadiene-styrene SBS, styrene-isoprene-styrene SIS, styrene-isobutylene-styrene SIBS, and a combination thereof.

For example, the first elastomer and the second elastomer may individually include styrene-ethylene-butylene-styrene SEBS.

In some example embodiments, the first elastomer and the second elastomer may have an elastic modulus by controlling a ratio of the hard-structural unit and the soft-structural unit, as described above.

For example, a weight ratio of the hard-structural unit of the second elastomer (e.g., of the plurality of auxiliary structures 210) relative to the soft-structural unit of the second elastomer may be greater (e.g., larger) than a weight ratio of the hard-structural unit of the first elastomer (e.g., of the substrate 110) relative to the soft-structural unit of the first elastomer, and accordingly, the second elastomer may have a higher elastic modulus than that of the first elastomer. For example, the weight ratio of the hard-structural unit of the second elastomer relative to the soft-structural unit of the second elastomer may be greater than or equal to about twice, about 3 times, about 4 times, about 5 times, about 7 times, or about 10 times larger than the weight ratio of the hard-structural unit of the first elastomer relative to the soft-structural unit of the first elastomer.

For example, the weight ratio of the hard-structural unit of the second elastomer (e.g., of the plurality of auxiliary structures 210) relative to the soft-structural unit of the second elastomer may be greater (e.g., larger) than about 1 and within the range, greater than or equal to about 1.1, greater than or equal to about 1.2, greater than or equal to about 1.3, greater than or equal to about 1.4, greater than or equal to about 1.5, greater than or equal to about 1.7, greater than or equal to about 1.9, or greater than or equal to about 2.0, greater than about 1.0 and less than or equal to about 9.9, about 1.1 to about 9.9, about 1.2 to about 9.9, about 1.3 to about 9.9, about 1.4 to about 9.9, about 1.5 to about 9.9, about 1.7 to about 9.9, about 1.9 to about 9.9, or about 2.0 to about 9.9.

For example, the weight ratio of the hard-structural unit of the first elastomer (e.g., of the substrate 110) relative to the soft-structural unit of the first elastomer may be smaller (e.g., less) than about 1 and within the range, less than or equal to about 0.9, less than or equal to about 0.8, less than or equal to about 0.7, less than or equal to about 0.6, less than or equal to about 0.5, less than or equal to about 0.4, or less than or equal to about 0.3, about 0.01 to about 0.9, about 0.01 to about 0.8, about 0.01 to about 0.7, about 0.01 to about 0.6, about 0.01 to about 0.5, about 0.01 to about 0.4, or about 0.01 to about 0.3.

For example, the weight ratio of the hard-structural unit relative to the soft-structural unit of the second elastomer may be greater than or equal to about 1.2, and the weight ratio of the hard-structural unit relative to the soft-structural unit of the first elastomer may be less than or equal to about 0.7.

For example, the weight ratio of the hard-structural unit relative to the soft-structural unit of the second elastomer may be greater than or equal to about 1.5, and the weight ratio of the hard-structural unit relative to the soft-structural unit of the first elastomer may be less than or equal to about 0.5.

In this way, the first elastomer and the second elastomer are adjusted to have a different ratio of the hard-structural unit and the soft-structural unit, so that the substrate 110 and the auxiliary structure 210 may have a desired (e.g., particular) elastic modulus.

Referring to FIG. 3, when the substrate 110 is elongated in one direction (e.g., x direction), high strain may be applied to the unit device 300/connecting wire 121 due to a large elastic modulus difference of the substrate 110 and the unit device 300/connecting wire 121. Particularly, the stress (strain) may be concentrated on a particular position such as a contact part of the unit device 300 with the connecting wire 121. The auxiliary structure 210 has an elastic modulus which is larger than that of the substrate 110 but smaller than that of the unit device 300/connecting wire 121, and accordingly, when the substrate 110 is elongated, the stress (strain) applied to the unit device 300/connecting wire 121 may be gently dispersed and thus prevent damage on the unit device 300/connecting wire 121 due to a breakage, a crack, and/or the like.

Accordingly, the stretchable device 100 according to some example embodiments may flexibly respond to an external force or an external motion such as twisting, pressing, and pulling of the substrate in a particular (or, alternatively, predetermined) direction and simultaneously, effectively prevent separation or detachment of the substrate 110 from the auxiliary structure 210 due to the external force or the external motion and in addition, may prevent stress (strain) concentration on a particular position such as a contact part of the stretchable device 300 with the connecting wire 121 by gently dispersing the stress (strain) applied to the unit device 300/connecting wire 121 and effectively reduce or prevent damage of the stretchable device 300 and/or connecting wire 121 by adjusting the elastic modulus of the auxiliary structure 210 and thus smoothly dispersing the stress (strain) applied to the stretchable device 300 and/or connecting wire 121.

The aforementioned stretchable device 100 may be applied to (e.g., included in) various devices requiring stretchability, for example, a bendable display panel, a foldable display panel, a rollable display panel, a wearable device, a skin-like display panel, a skin-like sensor, a large-area conformable display, smart clothing, and the like, but is not limited thereto.

For example, the above stretchable device 100 may be included in the skin-like display panel.

Figure 4:
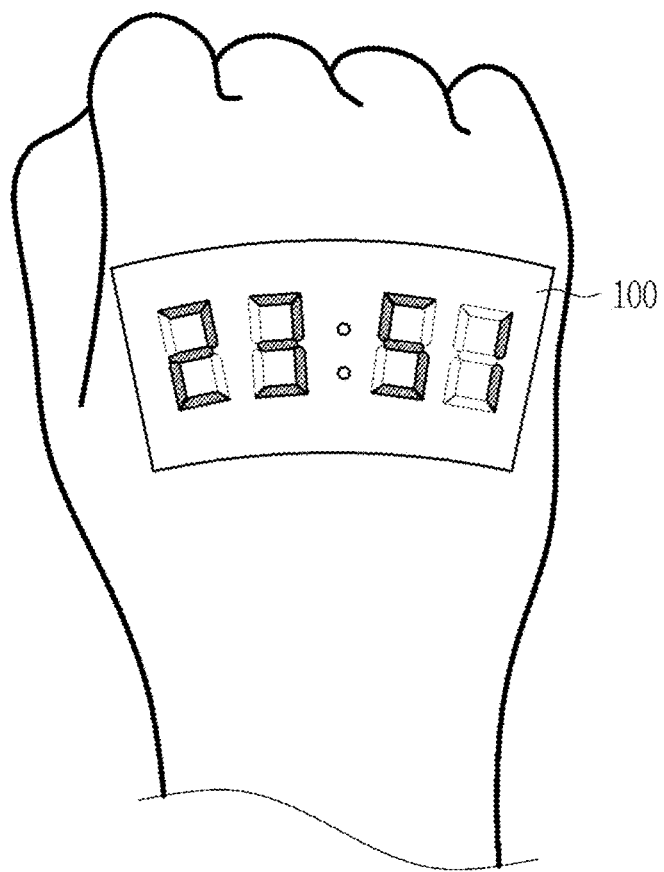
FIG. 4 is a schematic view showing an example of a skin-like display panel according to some example embodiments.
Figure 5A:
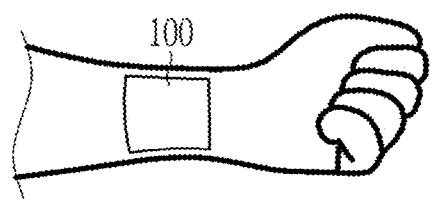
FIGS. 5A, 5B, and 5C and FIG. 6 are schematic views showing examples of biometric sensors according to some example embodiments.
Figure 5B:
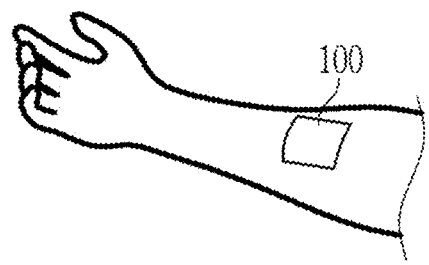
Figure 5C:
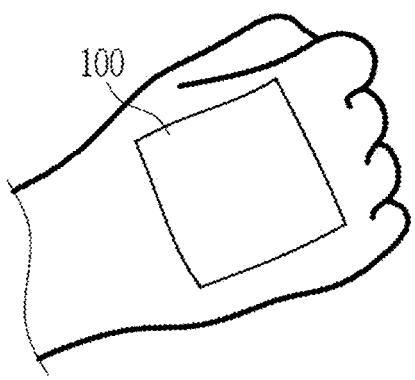
Figure 6:
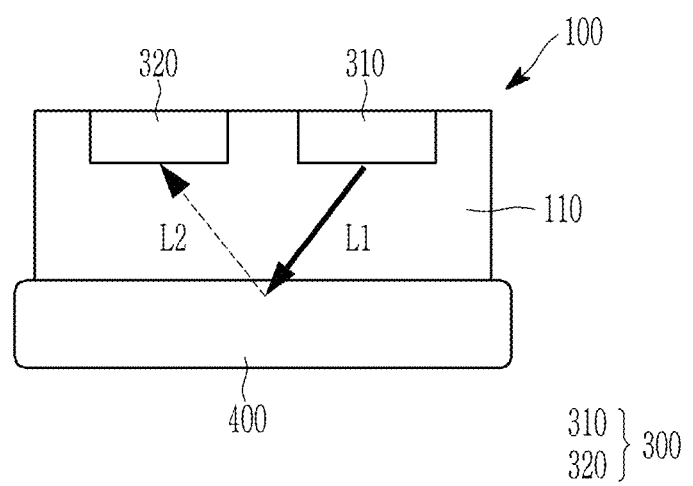

FIG. 4 is a schematic view showing an example of a skin-like display panel according to some example embodiments.

The stretchable device 100 may be (e.g., may be included in) the skin-like display panel, an ultrathin display panel, and thus used by being attached to a part of the living body such as a hand. The skin-like display panel may display particular (or, alternatively, predetermined) information such as various letters and/or images. The skin-like display panel may include, for example, a light emitting device such as an inorganic light emitting diode, a micro light emitting diode, an organic light emitting diode (OLED), a quantum dot light emitting diode, or a Perovskite light emitting diode as the aforementioned unit device 300, but is not limited thereto.

For example, the above stretchable device 100 may be included in a sensor such as a biometric sensor.

FIGS. 5A, 5B, and 5C and FIG. 6 are schematic views showing examples of biometric sensors according to some example embodiments.

The stretchable device 100 may be (e.g., may be included in) an attachable biometric sensor, and may be attached to a surface of a living body such as a skin, a living body such as an organ, or an indirect means for contacting a living body such as clothing to detect and measure biological information such as a biological signal. For example, the biometric sensor may include an electroencephalogram EGG sensor, an electrocardiogram ECG sensor, a blood pressure BP sensor, an electromyography EMG sensor, a blood glucose BG sensor, a photoplethysmography PPG sensor, an accelerometer, a RFID antenna, an inertial sensor, an activity sensor, a strain sensor, a motion sensor, or a combination of these, but is not limited thereto. The biometric sensor may be attached to a living body in a very thin patch-typed or band-typed form, so that the biological information may be monitored in real time.

The stretchable device 100 may include a light emitting device 310 and a light absorbing device 320 as the unit device 300 described above. The light emitting device 310 may be configured to emit a first light L1 for sensing a biological signal. The light emitting device 310 may be for example an infrared light emitting diode configured to emit first light L1 in an infrared wavelength spectrum or a visible light emitting diode configured to emit the first light L1 in a visible wavelength spectrum. The first light L1 emitted from the light emitting device 310 may be reflected by or absorbed in an object 400 (e.g., a body such as a skin or a blood vessel).

The light absorbing device 320 may be configured to absorb the second light L2 reflected by the object 400 from the first light L1 emitted from the light emitting device 310 and convert the absorbed light into an electric signal. The electric signal converted from the reflected second light L2 may include body information. Electric signal including biometric information may be transmitted to a sensor IC (not shown) or a processor (not shown).

As an example, the stretchable device 100 may be a photoplethysmography sensor PPG, and the biological information may include a heart rate, oxygen saturation, stress, arrhythmia, blood pressure, and the like, and may be obtained by analyzing waveforms of electric signals.

For example, the stretchable device 100 may be an electromyography EMG sensor or a strain sensor attached to a joint for rehabilitation treatment of patients with joint and muscle problems. The electromyography EMG sensor or the strain sensor may be attached to a desired site to quantitatively measure muscle movement or joint movement to secure data necessary for rehabilitation.

The aforementioned stretchable device, display panel, or sensor may be included in various electronic devices, and the electronic devices may further include a processor (not shown) and a memory (not shown). The electronic devices may be a mobile; TV; a health care device, and the like, and the health care device may include, for example, a photoplethysmography PPG sensor, an electroencephalogram EEG sensor, an electrocardiogram ECG sensor, a blood pressure BP sensor, an electromyography EMG sensor, a blood glucose BG sensor, an accelerometer, a RFID antenna, an inertial sensor, an activity sensor, a strain sensor, a motion sensor, or a combination thereof, but is not limited thereto.

Figure 7:
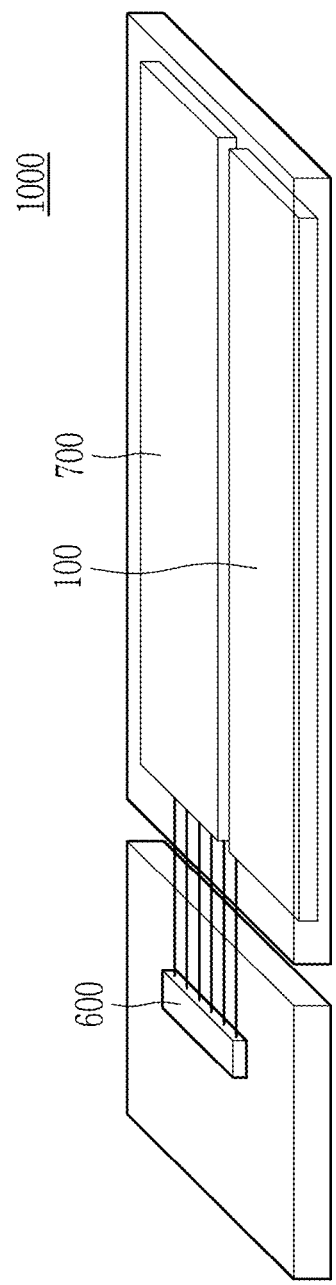
FIG. 7 is a schematic view showing an example of a health care device according to some example embodiments.

FIG. 7 is a schematic view showing an example of a health care device according to some example embodiments.

Referring to FIG. 7, the health care device 1000 (e.g., an electronic device) according to some example embodiments may be a patch-type or band-type attachable health care device and include the aforementioned stretchable device 100; an IC and/or processor 600 for processing biological signals obtained from the stretchable device 100, and display area 700 displaying the obtained biological signals into various letters and/or images.

Hereinafter, some example embodiments are illustrated in more detail with reference to one or more examples. However, the present scope of the example embodiments is not limited to said examples.

Manufacture of Stretchable Device

EXAMPLE

A polymer solution for auxiliary structures is prepared by dissolving styrene-ethylene-butylene-styrene SEBS including a styrene structural unit and an ethylene/butylene structural unit in a ratio of 67:33 (w/w) (H1043, Asahi Kasei Corp.) and a hardener in toluene. Then, the polymer solution for auxiliary structures is coated on a glass substrate with a sacrificial layer and then, dried, cured, and patterned to form a plurality of auxiliary structures having a thickness of 5 pm (an elongation rate: about 20%, elastic modulus: about 80 MPa). Subsequently, a polymer solution for a stretchable substrate is prepared by dissolving styrene-ethylene-butylene-styrene SEBS including a styrene structural unit and an ethylene/butylene structural unit in a ratio of 20:80 (w/w) (H1052, Asahi Kasei Corp.) and a hardener in toluene. Then, the polymer solution for a stretchable substrate is coated on the plurality of auxiliary structures and dried to form a 2.5 μm stretchable substrate (an elongation rate: 700%, an elastic modulus: ~1 MPa). Subsequently, on the stretchable substrate, a positive electrode and an Au wire electrically connected thereto are formed through photolithography and further formed a light emitting device having a stacked structure of positive electrode/hole injection layer (HIL)/organic light emitting layer/electron injection layer (EIL)/negative electrode, and thus manufacture a stretchable device. Subsequently, the sacrificial layer is removed to separate the stretchable device from the glass substrate.

Comparative Example 1

A stretchable device is manufactured according to the same method as Example except for not forming the plurality of auxiliary structures.

Comparative Example 2

On a PDMS substrate (an elongation rate: about 200%, an elastic modulus: about 40 MPa), a precursor solution for polyimide is coated and cured to form a polyimide layer. Subsequently, the polyimide layer is patterned through photolithography to form a plurality of polyimide structures (an elongation rate: about 5%, an elastic modulus: about 1 GPa). Subsequently, a positive electrode and an Au wire electrically connected thereto are formed on the polyimide structure through photolithography, and further formed a light emitting device having a stacked structure of positive electrode/hole injection layer (HIL)/organic light emitting layer/electron injection layer (EIL)/negative electrode to manufacture a stretchable device.

Evaluation

Evaluation I

The stretchable devices according to the Example and Comparative Examples 1 and 2 are 20% elongated in both sides (an x direction) to evaluate whether the stretchable devices are damaged or not.

Whether the stretchable devices are damaged or not is evaluated by examining whether or not the stretchable devices are separated due to detachment after the elongation and whether or not the interface of the light emitting devices and the Au wires are damaged.

The results are shown in Table 1.

TABLE 1

|  | Detachment | Short circuit | Crack |
|---|---|---|---|
| Example | X | X | X |
| Comparative Example 1 | — | ○ | ○ |
| Comparative Example 2 | ○ | ○ | X |

Referring to Table 1, the stretchable device according to the Example exhibits no detachment and neither crack nor disconnection on the interface of the light emitting device and the Au wire after the elongation, but the stretchable device according to Comparative Example 2 exhibits detachment between PDMS substrate and polyimide structure after the elongation and the stretchable devices according to Comparative Examples 1 and 2 exhibit disconnection and/or crack on the interface of the light emitting device and the Au wire.

Evaluation II

The stretchable device according to the Example is 10% elongated in both sides (an x direction) for a strain evaluation.

Figure 8:
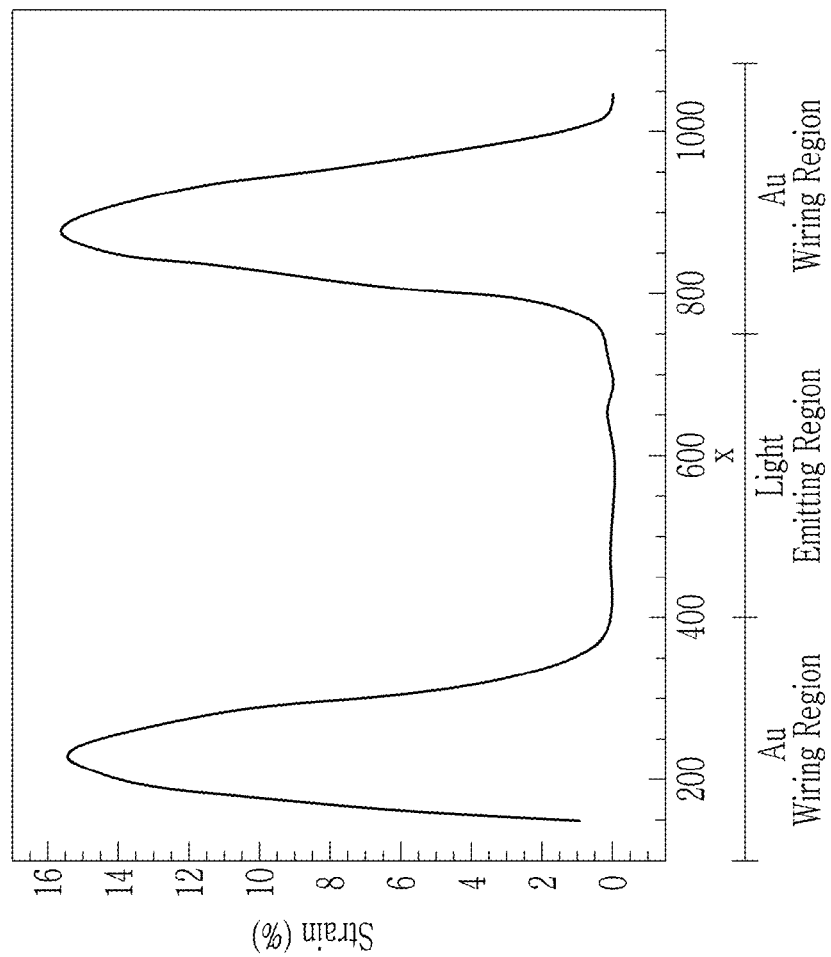
FIG. 8 is a graph showing the distribution of strains on wire and light emitting devices of a stretchable device according to an Example.

The results are shown in FIG. 8.

FIG. 8 is a graph showing strain distribution acting on a wire and light emitting devices of a stretchable device according to the Example.

Referring to FIG. 8, when the stretchable device according to the Example is 10% elongated in both sides (an x direction), the strain hardly acts on the light emitting device but the strain is concentrated on the Au wires at both sides of the light emitting device. Accordingly, since the strain generated during the elongation leads toward the Au wires, the stretchable device may stably work without deteriorating the light emitting device.

Evaluation III

When the stretchable device according to the Example is repetitively elongated in both sides (an x direction), electric characteristic change of the Au wires is evaluated.

The electric characteristics of the Au wires are evaluated by using resistance R changing according to an elongation rate in both sides and a variation ratio R/R0 of the resistance R relative to initial resistance R0.

Figure 9:
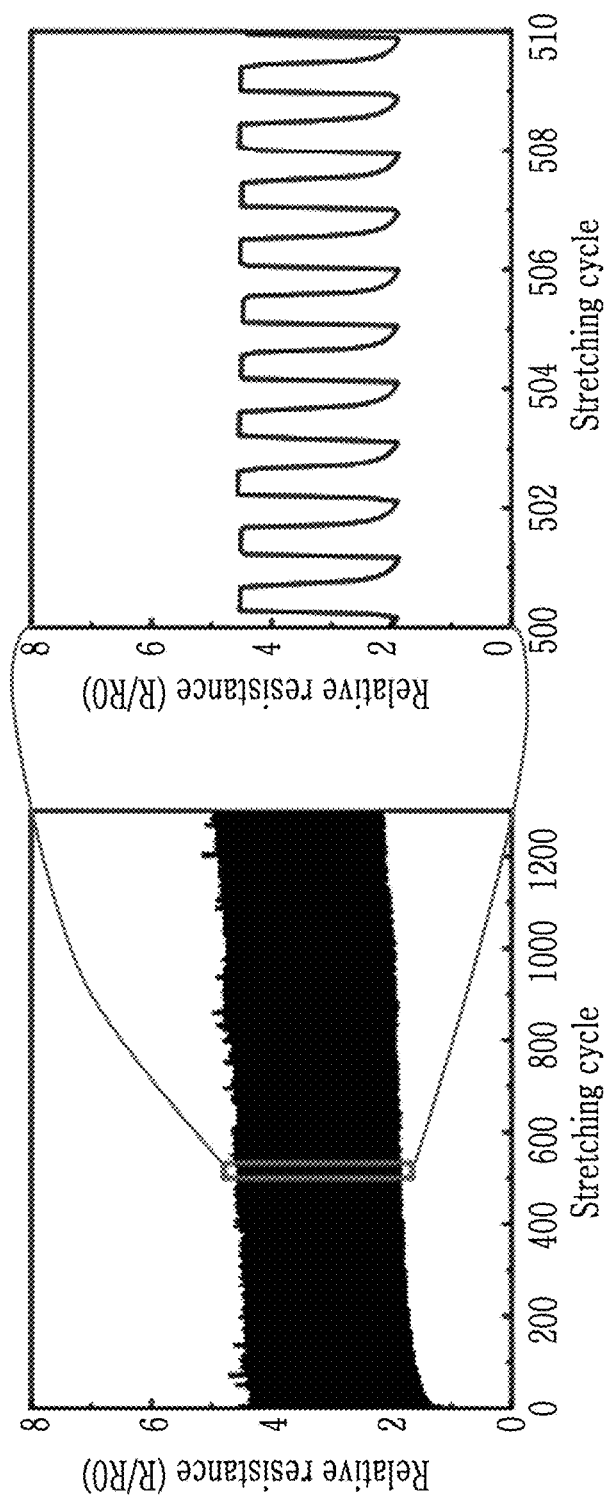
FIG. 9 is a graph showing changes in electrical characteristics of wire when repeatedly stretching a stretchable device according to an Example.

The results are shown in FIG. 9.

FIG. 9 is a graph showing changes in electrical characteristics of wires when repeatedly stretching a stretchable device according to the Example.

Referring to FIG. 9, the stretchable device according to the Example exhibits a relatively constant resistance value through repetitive elongations. Accordingly, in the stretchable device according to the Example, the wires turn out to have no damage due to the repetitive elongations.

While this disclosure has been described in connection with what is presently considered to be practical example embodiments, it is to be understood that the inventive concepts are not limited to the above-noted example embodiments. On the contrary, the inventive concepts are intended to cover various modifications and equivalent arrangements included within the spirit and scope of the appended claims.

What is claimed is:

1. A stretchable device, comprising:
a stretchable substrate including a first elastomer;
a plurality of unit devices on the stretchable substrate;
a connecting wire configured to electrically connect adjacent unit devices of the plurality of unit devices; and
a plurality of auxiliary structures, each auxiliary structure of the plurality of auxiliary structures at least partially overlapping with at least one unit device of the plurality of unit devices and/or the connecting wire in a vertical direction that is perpendicular to an upper surface of the stretchable substrate, the plurality of auxiliary structures each including a second elastomer,
wherein the first elastomer and the second elastomer are separate, respective polymers that commonly include at least one structural unit.
wherein the first elastomer is a first copolymer that includes a hard-structural unit of the first elastomer and a soft-structural unit of the first elastomer,
wherein the second elastomer is a second copolymer that includes a hard-structural unit of the second elastomer and a soft-structural unit of the second elastomer,
wherein the hard-structural unit of the first elastomer and the hard-structural unit of the second elastomer independently include a styrene-containing structural unit, an olefin-containing structural unit, or a combination thereof,
wherein a weight ratio of the hard-structural unit of the first elastomer to the soft-structural unit of the first elastomer is less than or equal to about 0.5, and
wherein a weight ratio of the hard-structural unit of the second elastomer to the soft-structural unit of the second elastomer is greater than or equal to about 1.5.

2. The stretchable device of claim 1, wherein an elastic modulus of the second elastomer is higher than an elastic modulus of the first elastomer.

3. The stretchable device of claim 1, wherein
an elastic modulus of the second elastomer is higher than an elastic modulus of the first elastomer, and
the elastic modulus of the second elastomer is lower than an elastic modulus of each separate unit device of the plurality of unit devices.

4. The stretchable device of claim 1, wherein the first elastomer and the second elastomer is a thermoplastic elastomer.

5. The stretchable device of claim 4, wherein the first elastomer and the second elastomer commonly belong to one of a styrene-containing polymer or an olefin-containing polymer.

6. The stretchable device of claim 1, wherein
the first elastomer and the second elastomer commonly include at least on hard-structural unit.

7. The stretchable device of claim 6, wherein each of the first elastomer and the second elastomer commonly include a styrene-containing structural unit.

8. The stretchable device of claim 6, wherein the soft-structural unit of the first elastomer and the soft-structural unit of the second elastomer each include an ethylene structural unit, a propylene structural unit, a butylene structural unit, an isobutylene structural unit, a butadiene structural unit, an isoprene structural unit, or a combination thereof.

9. The stretchable device of claim 1, wherein
the plurality of unit devices are on the upper surface of the stretchable substrate, and
each auxiliary structure of the plurality of auxiliary structures is under or at least a portion of the stretchable substrate such that
the portion of the stretchable substrate is between the plurality of auxiliary structures and the plurality of unit devices in the vertical direction,
a lower surface of each auxiliary structure is exposed from a lower surface of the stretchable substrate, and the lower surface of each auxiliary structure is coplanar with the lower surface of the stretchable substrate.

10. The stretchable device of claim 1, wherein an area of each particular auxiliary structure is larger than an area of a corresponding unit device of the plurality of unit devices at least partially overlapped by the particular auxiliary structure.

11. The stretchable device of claim 1, wherein the plurality of unit devices each include a light emitting device, a light absorbing device, a transistor, a resistance device, an imaging device, or a combination thereof.

12. A stretchable device, comprising:
a stretchable substrate;
a plurality of unit devices on the stretchable substrate;
a connecting wire configured to electrically connect adjacent unit devices of the plurality of unit devices; and
a plurality of auxiliary structures under or on or inside the stretchable substrate, the plurality of auxiliary structures at least partially overlapping with at least one unit device of the plurality of unit devices and/or the connecting wire in a vertical direction that is perpendicular to an upper surface of the stretchable substrate,
wherein the stretchable substrate includes a first copolymer, the first copolymer including a hard-structural unit and a soft-structural unit,
wherein each auxiliary structure of the plurality of auxiliary structures includes a second copolymer, the second copolymer including a hard-structural unit and a soft-structural unit,
wherein the hard-structural unit of the first copolymer and the hard-structural unit of the second copolymer independently include a styrene-containing structural unit, an olefin-containing structural unit, or a combination thereof,
wherein a weight ratio of the hard-structural unit of the second copolymer to the soft-structural unit of the second copolymer is larger than a weight ratio of the hard-structural unit of the first copolymer to the soft-structural unit of the first copolymer,
wherein the weight ratio of the hard-structural unit of the first copolymer to the soft-structural unit of the first copolymer is less than or equal to about 0.5, and
wherein the weight ratio of the hard-structural unit of the second copolymer to the soft-structural unit of the second copolymer is greater than or equal to about 1.5.

13. The stretchable device of claim 12, wherein
the stretchable substrate and the plurality of auxiliary structures commonly include at least one same hard-structural unit, and
the at least one same hard-structural unit includes a styrene-containing structural unit.

14. The stretchable device of claim 12, wherein the soft-structural unit of the second copolymer and the soft-structural unit of the first copolymer each include an ethylene structural unit, a propylene structural unit, a butylene structural unit, an isobutylene structural unit, a butadiene structural unit, an isoprene structural unit, or a combination thereof.

15. The stretchable device of claim 12, wherein the stretchable substrate and the plurality of auxiliary structures each include one of styrene-ethylene-butylene-styrene SEBS, styrene-ethylene-propylene-styrene SE PS, styrene-butadiene-styrene SBS, and styrene- isoprene-styrene SIS, styrene-isobutylene-styrene SIBS, or a combination thereof.

16. A display panel comprising the stretchable device of claim 1.

17. A sensor comprising the stretchable device of claim 1.

* * * * *